United States Patent [19]

Herting et al.

[11] 4,446,221

[45] May 1, 1984

[54] ANODIZED SUPPORTS AND RADIATION SENSITIVE ELEMENTS THEREFROM

[75] Inventors: Hans P. Herting, Osterode, Fed. Rep. of Germany; Jen-Chi Huang, Ossining; Eugene Golda, Monsey, both of N.Y.

[73] Assignee: Polychrome Corporation, Yonkers, N.Y.

[21] Appl. No.: 451,661

[22] Filed: Dec. 21, 1982

Related U.S. Application Data

[63] Continuation-in-part of Ser. No. 263,961, May 15, 1981, abandoned.

[51] Int. Cl.$^3$ .............................................. G03F 7/02

[52] U.S. Cl. .................................... 430/302; 430/278; 430/166; 204/35 N; 204/58; 204/35 R

[58] Field of Search ............... 430/278, 302, 166, 306, 430/326; 204/35 N, 35 A, 58; 427/419.2; 428/469; 430/326

[56] References Cited

U.S. PATENT DOCUMENTS

| | | | |
|---|---|---|---|
| 1,336,759 | 4/1920 | Schmidt | 260/505 C |
| 2,755,239 | 7/1956 | Glauser et al. | 204/35 N |
| 3,171,797 | 3/1965 | Klingenmaier | 204/35 N |
| 3,511,661 | 5/1970 | Rauner et al. | 430/278 |
| 3,549,365 | 12/1970 | Thomas | 430/278 |
| 3,767,474 | 10/1973 | Cohn | 204/35 N |
| 4,116,695 | 9/1978 | Mori et al. | 204/35 N |
| 4,191,570 | 3/1980 | Herting et al. | 430/302 |

*Primary Examiner*—Won H. Louie, Jr.

[57] ABSTRACT

An improved anodized support material comprising an anodized support material which has been treated with an alkali metal salt of a condensed aryl sulfonic acid following or during anodization; an improved radiation sensitive element comprising the above impróved supports to which has been applied a radiation-sensitive composition and improved lithographic printing plates prepared from said elements.

2 Claims, No Drawings

ANODIZED SUPPORTS AND RADIATION SENSITIVE ELEMENTS THEREFROM

This application is a continuation-in-part of Ser. No. 263,961, filed May 15, 1981, now abandoned.

This invention relates to lithographic printing plates. More particularly, the invention pertains to an improved support for use in the preparation of such plates, radiation-sensitive elements prepared from such supports and lithographic printing plates prepared from said elements.

Radiation sensitive elements, which may be converted to lithographic printing plates, comprise a radiation-sensitive layer in which the printing image is photomechanically produced; and a suitable support which, from the production of the material until its processing into a printing plate, carries the radiation-sensitive layer and is stored therewith until the material is used. After the production of the printing image, the support carries the printing image and simultaneously forms the image background in the image-free areas. A suitable support for a printing plate is one where the printing image areas developed from the radiation-sensitive layers must adhere very firmly to the support. Further, the support must have a hydrophilic surface, and the repelling effect thereof with respect to oleophilic printing inks must not decrease under the multiple printing requirements. The support should have a surface structure which is porous so that the surface can retain sufficient water to have an adequate oil repelling effect with respect to the printing inks.

Aluminum oxide layers prepared by anodic oxidation of aluminum sheets or foils are extraordinarily abrasion resistant, and such anodized sheets have been found to be very useful in the production of long running printing plates. However, such plates suffer from disadvantages caused by too great a penetration of the radiation-sensitive composition into the pores of the anoidic oxide support.

In the past such disadvantages have been obviated, for example, by treating the anodized support with an aqueous solution of sodium silicate, ammonium or alkali bichromate, iron ammonium oxalate or a dyestuff which can react chemically with the aluminum oxide surface prior to coating the latter with the radiation-sensitive composition.

However, these processes also suffer from certain disadvantages. Thus, treatment with alkali metal silicate entails the requirement of thorough rinsing with water when the support is to be provided with a storable radiation-sensitive layer adapted to be stored over a long period without deterioration of the radiation-sensitive layer. But even after thorough rinsing with water or neutralization with dilute acids, the alkali metal silicate layer or perhaps the alkali residue remaining from the silicate solution may undergo undesirable degradation. When the mentioned aqueous chromate solutions are used, a barely hydrophilic intermediate layer is obtained. Furthermore, the use of chromium-containing compositions is now considered environmentally undesirable. Similar considerations, except for the environmental, apply to treatment with an iron ammonium oxalate solution, the iron content of which may cause a dark discoloration.

When using aqueous solutions of dyestuffs that chemically react with the aluminum oxide surface, the hydrophilic properties of the aluminum oxide layer are reduced. Consequently, a printing plate material produced with a support treated in this manner tends to scum more during printing. In addition, the aluminum oxide surfaces chemically altered by means of dyestuffs cannot be easily corrected.

The improved support according to the present invention has been found to overcome the above disadvantages.

SUMMARY OF THE INVENTION

It has been found in accordance with the present invention that an improved radiation-sensitive element may be prepared by applying a radiation-sensitive composition to an improved support material said improved material comprising an anodized aluminum which has been treated with an aqueous solution of an alkali metal salt of a condensed aryl sulfonic acid either during the anodization process or thereafter, the latter being preferred.

It is therefore an object of the present invention to provide an improved support material for use in the preparation of radiation-sensitive elements which may prevent undesirable penetration of the radiation-sensitive composition into the support material as well as staining and scuming during press runs.

This and other objects of the invention will be more fully understood by reference to the following detailed description of the invention as well as the illustrative embodiments.

DETAILED DESCRIPTION OF THE PREFERRED EMBODIMENT

As indicated above, the present invention provides an improved support material, for use in the radiation-sensitive elements which are useful in the preparation of long running lithographic printing plates, which are free of background contamination. The improved support material comprises any of the known anodized support materials which are deliberately treated with an aqueous bath comprising an alkali metal salt of a condensed aryl sulfonic acid subsequent to or during the anodization step.

The arylsulfonic acid salts useful according to the instant invention include the naphthalene sulfonates in which two or more naphthalene nuclei are joined by alkylene groups. The prototype of this class is dinaphthylmethanedisulfonic acid, the disulfonic acid having a formula as follows:

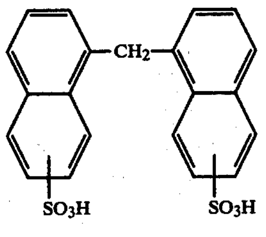

Products of this class are of indefinite composition. They may be manufactured by heating naphthalene, formaldehyde, and sulfuric acid together, or by treating naphthalene sulfonic acids with formaldehyde. Thus three or more naphthalene nuclei may be joined together by alkylene groups to yield a condensation polymer. Lower alkylated naphthalenes may also be used in the reaction. An example is monoisopropylnaphthalene.

In place of naphthalene, other aromatic hydrocarbons may be employed such as benzene, diphenyl, anthracene, phenanthrene, fluorene, etc., or homologues or derivatives thereof. The salts of the foregoing acids, such as the sodium slats possess similar properties. The production of dispersing agents of this type is described in detail in the literature and in prior art patents including U.S. Pat. No. 2,802,845 and representative compounds are available commercially under the trademarks Tamol, Leukanol and Daxad.

Particularly useful for the instant invention are the sodium salts of condensed naphthalene sulfonic acids known as Tamol SN and Tamol N Micro which are available commercially from Rohm & Haas.

The support material may be any of those known in the art including aluminum and its alloys. A preferred support material is selected from aluminum metal and its lithographically suitable alloys.

If desired, the support material may be subjected to one or more treatments during or after said anodization treatment with one or more treatments such as graining, e.g., chemical, mechanical or electrochemical; degreasing; desmutting, and the like.

The anodization may be effected in any manner known in the art including immersion of the substrate in an aqueous bath comprising $H_2SO_4$, $H_3PO_4$, and the like, as well as mixtures thereof, and subjecting it to a current density in an AC or DC field.

According to one embodiment of the invention, an anodized support material is prepared by subjecting a metal sheet or web which may have been pretreated as indicated above, to a current density of about 1 to about 10 A/dm$^2$ at about 10 to about 100 volts DC, in an aqueous acid bath having an acid concentration of from about 5 to 30% wt. for about 5 seconds up to 60 minutes, and preferably about 0.5 to 5 minutes. The resulting anodized support is then treated with an aqueous solution of the alkali salt of the condensed aryl sulfonic acid whose concentration is from about 0.5 to 45%, and preferably from about 5 to 10% wt. The sulfonic acid solution is adjusted to an acidic pH. Satisfactory results may also be obtained when the pH is about 1.5 pH by the addition of $H_2SO_4$ or $H_3PO_4$. Ambient or room temperatures are preferred, but treatment temperature up to 50° C., can be utilized effectively.

The anodization is most preferably effected in a bath of about 20% wt. aqueous $H_2SO_4$ at about 2.6 A/dm$^2$ and about 20 volts DC for about 1 minute. The condensed aryl sulfonic acid comprises about 7.5% by weight of the aqueous treating solution, which is applied to the anodized metal support material by any means such as dipping, sponging, and squeegeeing.

In an alternative procedure of the instant invention, the anodization and interlayering processes are effected approximately simultaneously by inclusion of the arylsulfonic acid salt in the anodization bath. According to this procedure, the bath comprises from about 15 to about 30% wt. $H_2SO_4$ and about 0.5 to about 10% wt. of the sulfonic acid salt. Preferably the bath comprises about 20% wt. $H_2SO_4$ and about 1% wt. sulfonic acid salt.

According to the instant invention there is also provided an improved radiation-sensitive element which comprises any of the improved supports upon which has been coated any radiation-sensitive composition as known in the art, e.g., positive-acting compositions, such as are described, e.g., in U.S. Pat. No. 4,189,320 (issued Feb. 19, 1980) and 3,785,825 (issued Jan. 16, 1974) and negative-acting compositions, such as are described, e.g., in U.S. Pat. No. 3,382,069 (issued May 7, 1968). Said coatings are applied to the support material by any method known to the art including which coating, meniscus coating, and the like.

It has been found advantageous to rinse the plate with water after it has been subjected to interlayering step for better adhesion to the radiation-sensitive layer without losing the desirable characteristics of anti-staining and anti-scuming. The instant invention also provides a method for the preparation of improved lithographic printing plates which comprises the steps of imagewise exposing any of the above elements, in accordance with the invention, to radiation through a mask, development of said imagewise exposed element to remove the more soluble areas of the coating and, if desired, post-treating the developed element to produce a desirable lithographic printing plate.

The methods for exposure, development and post-treatment of the elements may be any of those known in the art including for example, the post-curing procedure described in U.S. Pat. No. 4,233,390 issued Nov. 11, 1980.

The following embodiments are illustrative only and are not meant to limit the present invention.

A sheet (25 cm×25 cm) of Al alloy (AA 1050) was grained using a wet slurry of pumice and then anodized in an aqueous bath comprising 20% wt. $H_2SO_4$ at room temperature and at 3.8 A/dm$^2$ for a period of 1 minute.

EXAMPLE 1

A sheet (25 cm×25 cm) of Al alloy (AA 1050) was grained using a wet slurry of pumice and then anodized in an aqueous bath comprising 20% wt. $H_2SO_4$ at 3.8 A/dm$^2$ for a period of 1 minute.

The thus anodized sheet was then dipped, at room temperature, into a bath comprising 75 g/l of TAMOL SN which was adjusted to a pH of 1.5 with $H_2SO_4$, for 30 seconds.

After the above treatment, the sheet was rinsed, dried, and then coated with a radiation-sensitive composition comprising a 1 to 1 mixture of a cresol formaldehyde resin with the condensation product of naphthoquinone-1,2-(diazide2)-5 sulfonyl chloride with a pyrogallol acetone resin, to yield a radiation-sensitive element which after image-wise exposure, development and post-treatment by means well known in the art yielded a lithographic printing plate, having a clean non-image area, that produced 65,000 acceptable impressions.

EXAMPLE 2

The method of Example 1 was repeated except that the anodizing bath comprised 20% wt. $H_2SO_4$ and 1% wt. TAMOL SN, and the dipping step was deleted. Similar results were obtained.

As previously set forth, the temperature at which the anodized support is contacted with the alkali metal salt of a condensed aryl sulfonic acid is an important aspect of the present invention. It was found, for example, that when the anodic oxide on aluminum surface contacted with TAMOL SN solutions at 90°–110° C. at which temperature pH was adjusted to 1.5 by addition of sulfonic acid, the anodic oxide was dissolved and the surface color became whiter. The aluminum surface for a printing plate requires certain hardness and anti-abrasion characteristics for length of press run. If oxide weight decreases during the TAMOL SN treatment, it indicates loss of durability of press run. This is not desirable for a surface to be a lithographic printing plate. The following Table indicates the oxide weight changing at various temperatures and dipping time.

TABLE

| % Tamol SN | Temp. °C. | Dipping Time Sec. | Oxide Wt. g/m$^2$ | Oxide Wt. % of wt loss during Tamol treatment |
|---|---|---|---|---|
| 5% | 30 | 60 | 2.32 | 0 |
| 5% | 90-100 | 5 | 2.27 | 2.2 |
| 5% | 90-100 | 60 | 0.058 | 97.5 |
| 45% | 90-100 | 5 | 2.25 | 3.0 |
| 45% | 90-100 | 60 | 0.76 | 67.2 |

Although all of the reasons for the substantial loss of anodic oxide are not fully understood at this time, it has been observed that both the pH of the TAMOL SN solution increases significantly while the TAMOL SN concentration decreased at the higher temperatures over operating periods that extend from 11 to 75 hours or longer.

It will be understood that the embodiments presented above are illustrative only, and that the invention is subject to variations and modifications without departing from its broader concepts.

What is claimed is:

1. In a method for preparing a lithographic printing plate comprising the steps of, I. exposing a radiation-sensitive element comprising an improved anodized support material of aluminum or an aluminum alloy having coated thereupon a radiation-sensitive composition to radiation through a mask; and II. developing the exposed element to remove the areas of greater solubility to produce the desired plate;

the improvement comprises treating an anodized support material with an aqueous solution of an alkali metal salt of a condensed arylsulfonic acid having an acidic pH prior to coating with said radiation-sensitive composition, said treatment being effected at a temperature of from about room temperature to 50° C. during or after anodization said arylsulfonic acid having two or more arylsulfonic acid nuclei joined by alkylene groups.

2. In the method of claim 1 wherein the thus treated anodized support is rinsed with water prior to coating.

* * * * *